（12） United States Patent
Joseph et al.

(10) Patent No.: US 11,848,668 B2
(45) Date of Patent: Dec. 19, 2023

(54) APPARATUS AND METHOD FOR ACTIVE INDUCTOR MODULATION

(71) Applicant: Microchip Technology Incorporated, Chandler, AZ (US)

(72) Inventors: Milish Joseph, Cote Saint-Luc (CA); Michael Venditti, Montreal (CA)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 17/939,782

(22) Filed: Sep. 7, 2022

(65) Prior Publication Data

US 2023/0291404 A1   Sep. 14, 2023

Related U.S. Application Data

(60) Provisional application No. 63/319,156, filed on Mar. 11, 2022.

(51) Int. Cl.
*H03K 3/012* (2006.01)
*H03K 19/0175* (2006.01)
*H03K 19/00* (2006.01)

(52) U.S. Cl.
CPC . *H03K 19/017545* (2013.01); *H03K 19/0013* (2013.01)

(58) Field of Classification Search
CPC ............... H03K 19/0013; H03K 19/017545
See application file for complete search history.

(56) References Cited

U.S. PATENT DOCUMENTS

| 8,026,754 | B2* | 9/2011 | Trivedi | H03K 3/356121 |
| | | | | 327/225 |
| 8,624,647 | B2* | 1/2014 | Chong | H03K 5/1534 |
| | | | | 327/175 |
| 11,671,012 | B2* | 6/2023 | Ruan | H02M 3/157 |
| | | | | 323/271 |
| 2016/0308584 | A1* | 10/2016 | Bernard | H04B 5/0031 |
| 2017/0194944 | A1* | 7/2017 | Hernes | H03K 5/1534 |

OTHER PUBLICATIONS

Search Report and Written Opinion of the International Searching Authority, European Patent Office, dated Feb. 13, 2023, International Application No. PCT/US2022/044725.
Shin Soyeong et al. entitled "A Clock Distribution Scheme Insensitive to Supply Voltage Drift With Self-Adjustment of Clos Buffer Delay," IEEE Transactions On Circuits And Systems II, Sep. 6, 2021, vol. 69, No. 3, pp. 814-818, Figs. 1-9.

* cited by examiner

*Primary Examiner* — Kurtis R Bahr
(74) *Attorney, Agent, or Firm* — Burr & Forman LLP; Ryan M. Corbett

(57) ABSTRACT

An active inductor modulator circuit is provided. The active inductor modulator circuit may include a circuit to receive an input signal and provide an output signal at an output terminal of the circuit based on a clock signal, a modulated active inductor coupled to the circuit to improve a time delay between the input signal and the provided output signal, and a modulation clock circuit to generate a delayed clock signal to enable the modulated active inductor prior to a transition of the output signal from a first logic state to a second logic state.

19 Claims, 10 Drawing Sheets

APPARATUS AND METHOD FOR ACTIVE INDUCTOR MODULATION

CROSS-REFERENCE TO RELATED APPLICATION

This application claims the benefit of U.S. Provisional Patent Application No. 63/319,156, filed on Mar. 11, 2022, which is incorporated herein by reference in its entirety.

TECHNICAL FIELD

The present disclosure relates generally to using active inductors to control the time delay between an input signal and an output signal, and more specifically to using active inductor modulation to control the time delay between an input signal and an output signal.

BACKGROUND

In high bandwidth applications with a high capacitive load, such as a clock distribution network, timing can be improved by using an active inductor, i.e. an inductor-less circuit whose impedance rises with frequency across a frequency range of interest. However, using active inductors may increase power consumption and the necessary voltage headroom. As the strength of the active inductor increases, both power and voltage headroom are increased. Moreover, while the use of active inductors may reduce the time delay between the input signal and the output voltage, the active inductor may limit the voltage swing of the output voltage. Therefore, there is a need to control the timing delay between the input signal and the output signal without using excess power and without degrading the voltage swing of the output voltage.

SUMMARY

According to an aspect of one or more examples, there is provided an active inductor modulator circuit including a circuit to receive an input signal and provide an output signal at an output terminal of the circuit based on a clock signal, a modulated active inductor coupled to the circuit to improve a time delay between the input signal and the provided output signal, and a modulation clock circuit to generate a delayed clock signal to enable the modulated active inductor prior to a transition of the output signal from a first logic state to a second logic state. The modulation clock circuit may receive the clock signal and generate the delayed clock signal that is delayed relative to the clock signal.

The modulated active inductor may include an inverter, a resistor coupled in parallel with the inverter, and a capacitor coupled in series with the resistor and inverter, wherein the resistor and the inverter are coupled to an output terminal of the circuit that provides the output signal. The modulated active inductor may include a an inverter, a resistor coupled in parallel with the inverter, a capacitor coupled in series with the resistor, a first switch coupled to a voltage supply and a second switch coupled to ground, wherein the first switch and the second switch are coupled to the inverter. The modulation clock circuit may generate a complementary delayed clock signal that is 180 degrees out of phase with the generated delayed clock signal. The complementary delayed clock signal and the delayed clock signal are to turn on the first switch and the second switch, respectively.

The modulation clock circuit may disable the modulated active inductor after the transition of the output voltage from the first logic state to the second logic state.

The first logic state may be a logic low state, and the second logic state may be a logic high state.

The modulated active inductor may include an inverter that includes first and second p-channel MOSFETs coupled in series, a resistor coupled between gate and drain terminals of the first p-channel MOSFET, and a capacitor coupled between the gate terminal of the first p-channel MOSFET and ground. The second p-channel MOSFET includes a gate terminal to receive the delayed clock signal, a source terminal coupled to a voltage supply, and a drain terminal coupled to a source terminal of the first p-channel MOSFET. The output signal may be provided at the drain terminal of the first p-channel MOSFET.

The modulated active inductor may include an inverter that includes first and second p-channel MOSFETs coupled in series to selectively couple the output terminal of the circuit to a voltage supply based on the delayed clock signal. A gate terminal of the second p-channel MOSFET is to receive the delayed clock signal, and a gate terminal of the first p-channel MOSFET is coupled to a capacitor and to the output terminal of the circuit via a resistor. The first and second p-channel MOSFETs are to couple the output terminal of the circuit to the voltage supply prior to a rising edge of the output signal.

The modulated active inductor may include an inverter that includes first and second n-channel MOSFETs coupled in series, a resistor coupled between gate and drain terminals of the second n-channel MOSFET, and a capacitor coupled between the gate terminal of the second n-channel MOSFET and ground. The first n-channel MOSFET may include a gate terminal coupled to the modulation clock circuit to receive the delayed clock signal, a source terminal coupled to ground, and a drain terminal coupled to a source terminal of the second n-channel MOSFET. The output signal may be provided at the drain terminal of the second n-channel MOSFET.

The modulated active inductor may include an inverter that includes first and second n-channel MOSFETs coupled in series to selectively couple the output terminal of the circuit to ground based on the delayed clock signal. A gate terminal of the first n-channel MOSFET is to receive the delayed clock signal, and a gate terminal of the second n-channel MOSFET is coupled to a capacitor and to the output terminal of the circuit via a resistor. The first and second n-channel MOSFETs are to couple the output terminal of the circuit to ground prior to a falling edge of the output signal.

According to an aspect of one or more examples, there is provided a method of improving a time delay between an input signal and an output signal of a circuit. The method may include receiving the input signal based on a clock signal, generating a delayed clock signal based on the clock signal, enabling a modulated active inductor that is coupled to the circuit prior to a transition of the output signal from a first logic state to a second logic state based on the delayed clock signal, and outputting the output signal that is time-delayed relative to the input signal by the time delay. The delayed clock signal may be generated so that the delayed clock signal is delayed relative to the clock signal.

The method may include generating a complementary delayed clock signal that is 180 degrees out of phase with the delayed clock signal. Enabling the modulated active inductor may include turning on first and second switches of the modulated active inductor based on the complementary delayed clock signal and the delayed clock signal, respectively. The modulated active inductor may be disabled after the transition of the output signal from the first logic state to the second logic state. The first logic state may be a logic low state, and the second logic state may be a logic high state. The first logic state may be a logic high state, and the second logic state may be a logic low state.

Enabling the modulated active inductor may include coupling an output terminal of the circuit to a voltage supply based on the delayed clock signal prior to a rising edge of the output signal. Enabling the modulated active inductor may include coupling an output terminal of the circuit to ground based on the delayed clock signal prior to a falling edge of the output signal.

DETAILED DESCRIPTION OF VARIOUS EXAMPLES

Figure 1A:
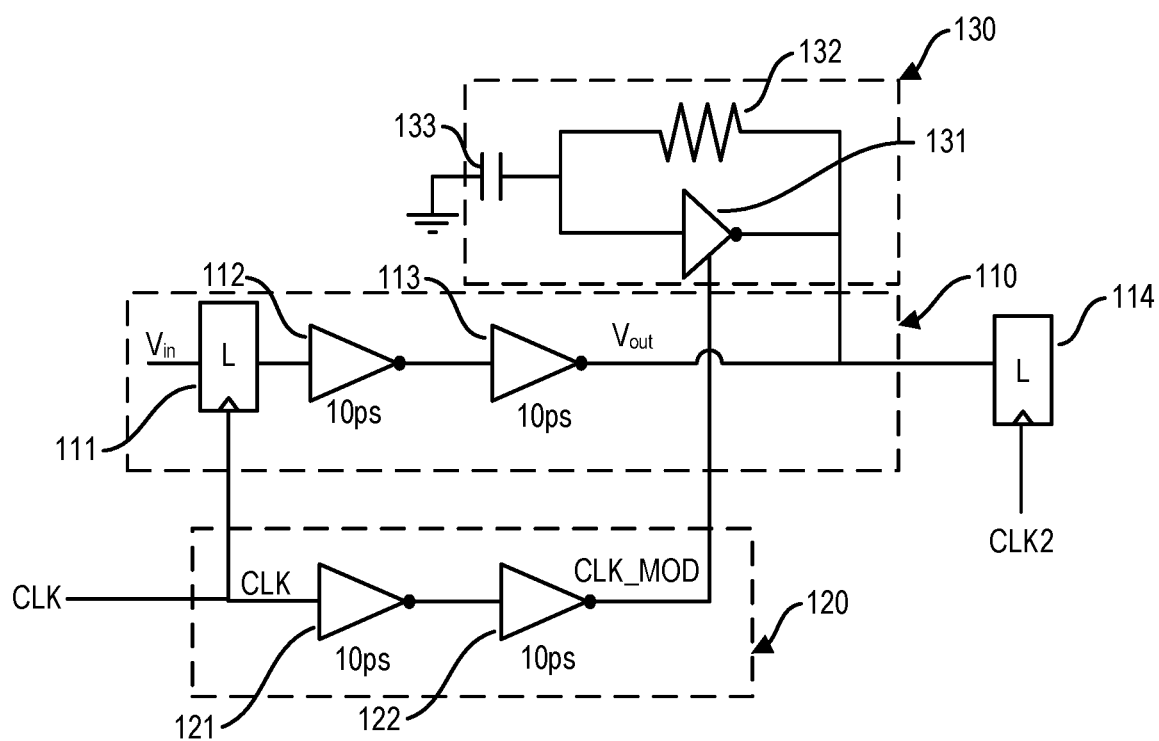
FIG. 1A illustrates a modulated active inductor topology according to one or more examples.

Reference will now be made in detail to the following various examples, which are illustrated in the accompanying drawings, wherein like reference numerals refer to like elements throughout. The following examples may be embodied in various forms without being limited to the examples set forth herein. Descriptions of well-known parts are omitted for clarity.

FIG. 1A is a circuit diagram according to one or more examples. Referring to FIG. 1A, the circuit may include circuit 110, which may include a first latch 111, a first inverter 112, and a second inverter 113. The first latch 111 may latch, based on a received clock signal CLK, an input signal Vin that varies between a logic high state and a logic low state. According to various examples, upon the rising edge of the clock signal CLK, the input signal Vin is latched and output from the first latch 111 to the first inverter 112, and first inverter 112 inverts the received signal and outputs the inverted received signal to the second inverter 113, which second inverter 113 generates an output signal Vout at an output terminal of circuit 110. The output signal Vout may be provided as input to various other components, such as a time-sensitive component, which in the example shown in FIG. 1A is shown as a second latch 114 coupled to the output terminal of circuit 110, but is not limited thereto. Each of the first inverter 112 and the second inverter 113 may cause a delay in the output signal Vout relative to the input signal Vin. For example, each of the first inverter 112 and the second inverter 113 may delay the output signal Vout by 10 ps relative to the input signal Vin. Although the circuit 110 shown in FIG. 1A includes first inverter 112 and second inverter 113, the first and second inverters 112, 113 may instead be buffers or other circuitry to delay the output signal Vout relative to the input signal Vin. The output signal Vout may be input to the second latch 114, which may latch the output signal Vout based on a rising edge of a second clock CLK2. However, if the output signal Vout is delayed in relation to the rising edge of the second clock CLK2, the second latch 114 may not latch the correct signal at the input of the second latch 114.

A modulated active inductor 130 may be coupled to the input terminal of the second latch 114 in order to control the delay between the input signal Vin and the output signal Vout. For example, the modulated active inductor 130 may include an inverter 131, which may be a tri-state inverter 131, a resistor 132 coupled in parallel with the tri-state inverter 131, and a capacitor 133 coupled in series with the tri-state inverter 131 and the resistor 132, i.e. capacitor 133 is coupled between an input of tri-state inverter 131 and ground, or other common potential, and the output of tri-state inverter 131 is coupled to the output of the second inverter 113. When the modulated active inductor 130 is enabled, the modulated active inductor 130 uses a positive feedback loop via resistor 132 to create a zero which resonates with pole at net of the output signal Vout, and thereby improves the bandwidth. In one example, when the output signal Vout is in a logic high state, and may transition to a logic low state responsive to clock signal CLK, the positive feedback loop created via resistor 132 provides the logic high signal to the input of the tri-state inverter 131, which drives the output signal Vout to a logic low state, thereby improving the bandwidth by improving, i.e. shortening, the fall time so as to improve the time delay experienced by Vout. When the output signal Vout is in a logic low state, and may transition to a high low state responsive to clock signal CLK, the positive feedback loop created via resistor 132 provides the logic high low signal to the input of the tri-state inverter 131, which drives the output signal Vout to a logic high state, thereby improving the bandwidth by improving, i.e. shortening, the rise time so as to improve the time delay experienced by Vout.

In the absence of modulation, the output signal Vout may be a large signal that swings between a logic high state and a logic low state. When the output signal Vout is in a logic high state, the tri-state inverter 131 drives the output signal Vout to a logic low state, effectively creating a short from the voltage supply to ground or a common potential that results in drawing large current and electromagnetic radiation issues.

A modulation clock circuit 120 may be coupled to the modulated active inductor 130 in order to modulate the modulated active inductor 130, which may mitigate these issues. More specifically, the modulation clock circuit 120 may include a third inverter 121 and a fourth inverter 122, and may receive the clock signal CLK. The third inverter 121 and the fourth inverter 122 are coupled in series and may each delay the clock signal to generate a delayed clock signal CLK_MOD, which is input to the tri-state inverter 131 of the modulated active inductor 130. The modulation clock circuit 120 may be designed based on the delay caused by the circuit 110, so as to approximate the delay of first inverter 112 and second inverter 113. For example, third and fourth inverters 121, 122 of the modulation clock circuit 120 may respectively delay the clock signal CLK by 10 ps or slightly less than 10 ps, based on the respective 10 ps delay caused by the first and second inverters 112, 113 of the circuit 110, so that delayed clock signal CLK_MOD is delayed in relation to clock signal CLK by the sum of the delays, i.e. by about 20 ps.

The delayed clock signal CLK_MOD is input to an enable input of the tri-state inverter 131 of the modulated active inductor 130 to enable the modulated active inductor 130 prior to the output signal Vout changing from a first logic state to a second logic state. The delayed clock signal CLK_MOD may be a differential clock signal that includes a complementary delayed clock signal CLK_MODB, which is 180 degrees out of phase with the delayed clock signal CLK_MOD, as described in more detail below. Modulation clock circuit 120, as shown, may enable the modulated active inductor 130 prior to a rising edge, and prior to a falling edge, or an unchanged condition, of the output signal Vout, responsive to a high logic state of CLK_MOD. In another example, the delayed clock signal CLK_MOD may enable the modulated active inductor 130 prior to a rising edge of the output signal Vout. Alternatively, the delayed clock signal CLK_MOD may enable the modulated active inductor 130 prior to a falling edge of the output signal Vout. By enabling the modulated active inductor 130 prior to the rising edge or the falling edge of the output signal Vout, the delay associated with the output signal Vout with respect to the input signal Vin may be controlled so that the output signal Vout is ready to be latched at second latch 114 based on the second clock CLK2.

Figure 1B:
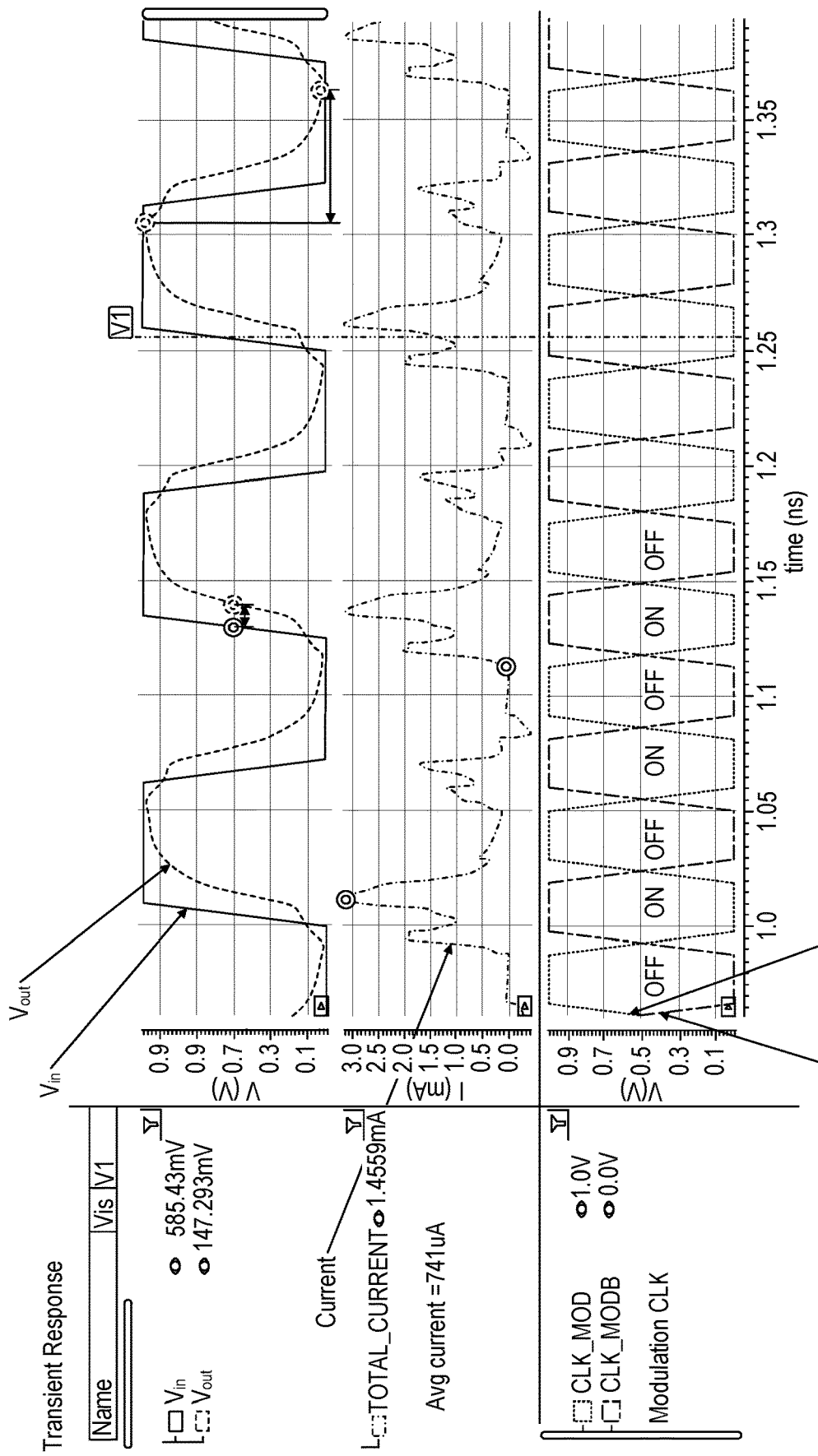
FIG. 1B illustrates waveform diagrams of the input signal, output signal, and current of a circuit with active inductor modulation according to various examples.

FIG. 1B shows example waveform diagrams for the input signal Vin, the output signal Vout, the current, and the modulated clock signal CLK_MOD (which may be a differential clock signal that includes a complementary delayed clock signal CLK_MODB, which is 180 degrees out of phase with the delayed clock signal CLK_MOD) based on the active inductor modulation scheme described in connection with FIG. 1A. As shown in FIG. 1B, the delay between the input signal Vin and the output voltage Vout is approximately 9 ps, while the voltage swing of the output signal Vout is approximately 960 mV, and the average current is approximately 740 uA.

Figure 1C:
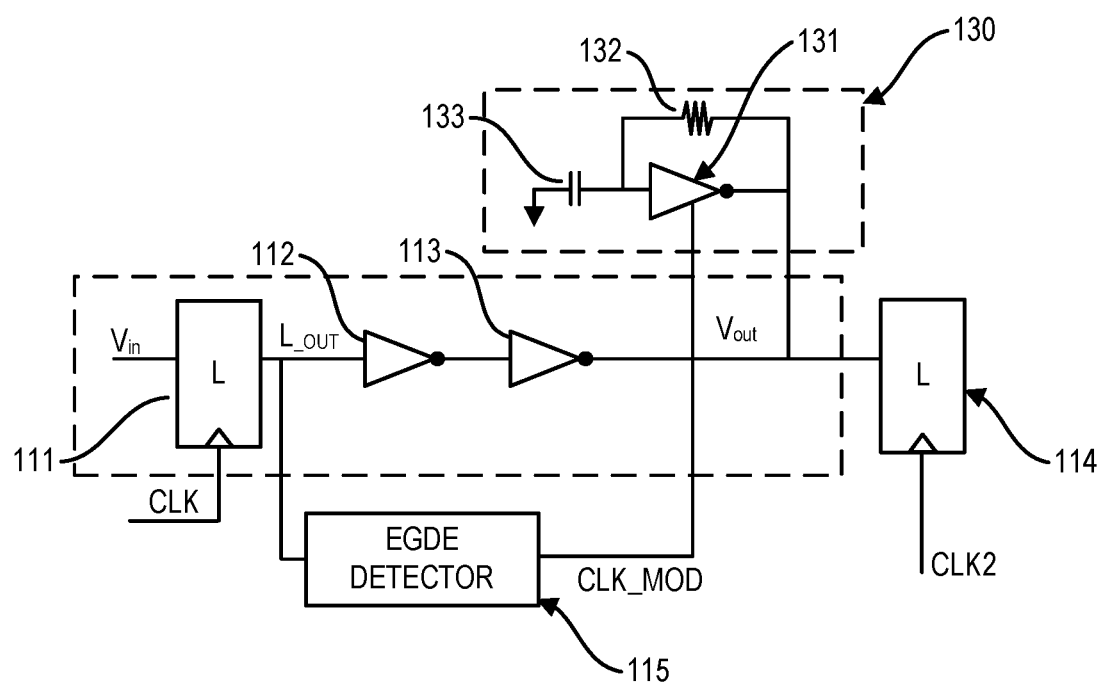
FIG. 1C illustrates a modulated active inductor topology according to one or more examples.
Figure 1D:
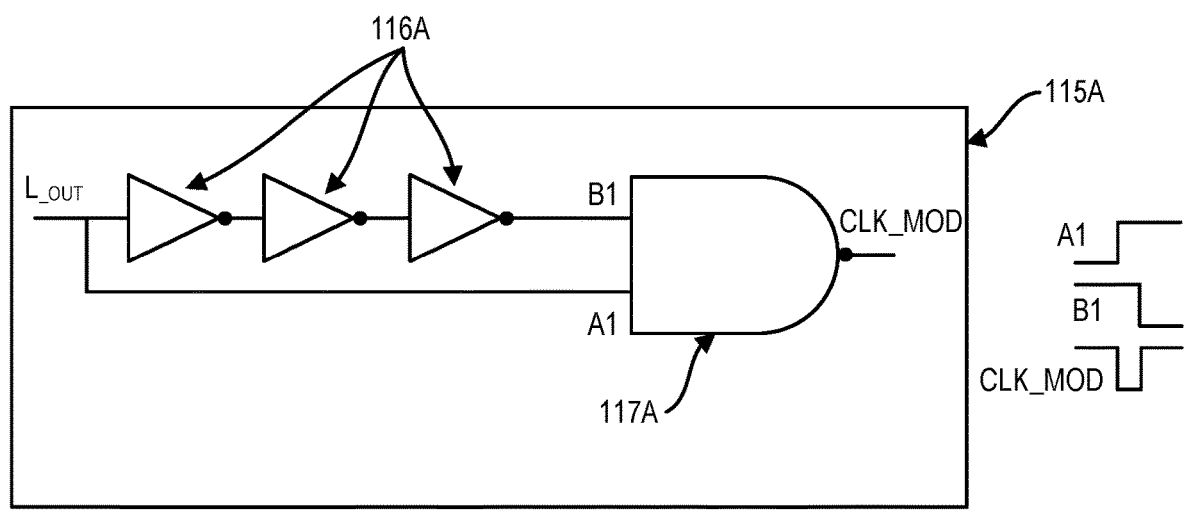
FIG. 1D illustrates a rising edge detector according to one or more examples.

FIG. 1C is a circuit diagram according to one or more examples. The circuit of FIG. 1C is similar to that of FIG. 1A, such that a description of the same components will not be repeated here to avoid redundancy. Referring to FIG. 1C, instead of the modulation clock circuit 120 of FIG. 1A, the circuit of FIG. 1C includes an edge detector 115, which may be implemented in many ways, as discussed further below. The edge detector 115 is to detect an edge of the output signal LOUT of the first latch 111, and output the delayed clock signal CLK_MOD upon detecting the edge of the output signal L_OUT. For example, FIG. 1D shows a rising edge detector 115A according to one or more examples, which includes three inverters 116A connected in series, and a NAND gate 117A. The output signal LOUT of the first latch 111 is input to a first input A1 of the NAND gate 117A, and is also input into the first inverter of the three inverters 116A. The output of the third inverter of the three inverters 116A is coupled to a second input B1 of the NAND gate 117A. As shown in the timing diagram of FIG. 1D, when the output signal L_OUT of the first latch 111 is logic low, the first input A1 receives a logic low signal, the second input B1 receives a logic high signal, and the NAND gate 117A outputs a logic high delayed clock signal CLK_MOD. When the output signal L_OUT of the first latch 111 changes to logic high, the NAND gate 117A outputs a logic low delayed clock signal CLK_MOD because the second input B1 of the NAND gate 117A still receives logic high signal because the change in the output signal L_OUT is delayed by the three inverters 116A. By changing the delayed clock signal CLK_MOD from logic high to logic low based on the change in the output signal LOUT, the rising edge detector 115A is able to detect the rising edge of the output signal LOUT, and output the delayed clock signal CLK_MOD to enable the inverter 131. The three inverters 116A each invert the output signal LOUT, resulting in a logic low signal received at the second input B1, which causes the delayed clock signal CLK_MOD to become logic high again.

Figure 1E:
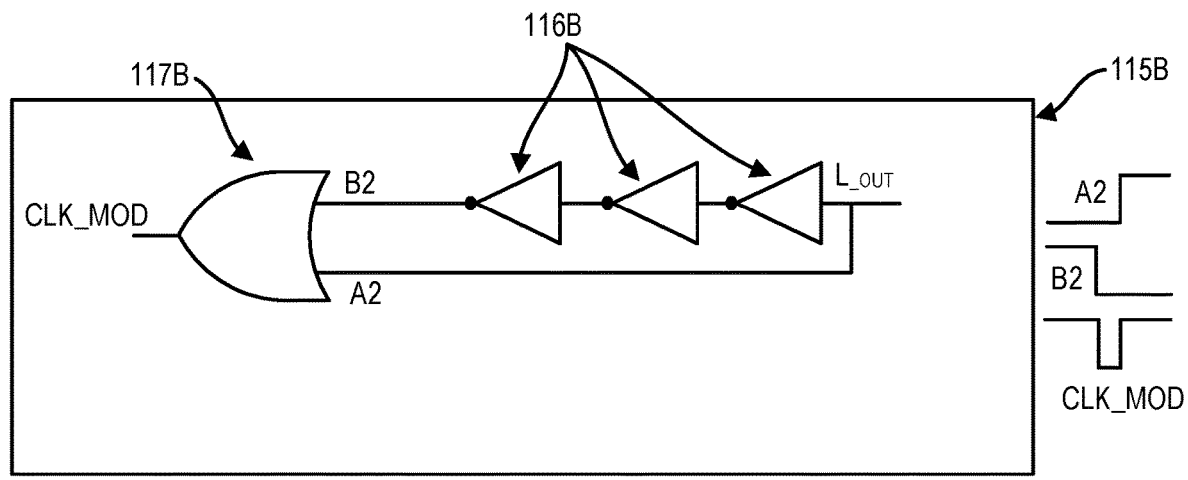
FIG. 1E illustrates a falling edge detector according to one or more examples.

FIG. 1E illustrates a falling edge detector 115B according to one or more examples. Similar to the rising edge detector 115A of FIG. 1D, the example falling edge detector 115B shown in FIG. 1E includes three inverters 116B connected in series, and an OR gate 117B. The output signal L_OUT of the first latch 111 is input to a first input A2 of the OR gate 117B, and is also input into the first inverter of the three inverters 116B. The output of the third inverter of the three inverters 116B is coupled to a second input B2 of the OR gate 117B. As shown in the timing diagram of FIG. 1E (to be read right to left), when the output signal L_OUT of the first latch 111 is logic high, the first input A2 receives a logic high signal, the second input B2 receives a logic low signal, and the OR gate 117A outputs a logic high delayed clock signal CLK_MOD. When the output signal LOUT of the first latch 111 changes to logic low, the OR gate 117B outputs a logic low delayed clock signal CLK_MOD because the second input B2 of the OR gate 117B still receives logic low signal because the change in the output signal L_OUT is delayed by the three inverters 116A. By changing the delayed clock signal CLK_MOD from logic high to logic low based on the change in the output signal L_OUT, the falling edge detector 115B is able to detect the falling edge of the output signal L_OUT, and output the delayed clock signal CLK_MOD to enable the inverter 131. After the output signal L_OUT has changed from logic high to logic low, the three inverters 116B each invert the output signal L_OUT, resulting in a logic high signal received at the second input B2, which causes the delayed clock signal CLK_MOD to become logic high again.

According to various examples, the edge detector could also be implemented using an XOR gate (not shown) instead of the NAND gate 117A and OR gate 117B. By using an XOR gate, the edge detector 115 could detect both rising and falling edges of the output signal L_OUT.

Figure 2:
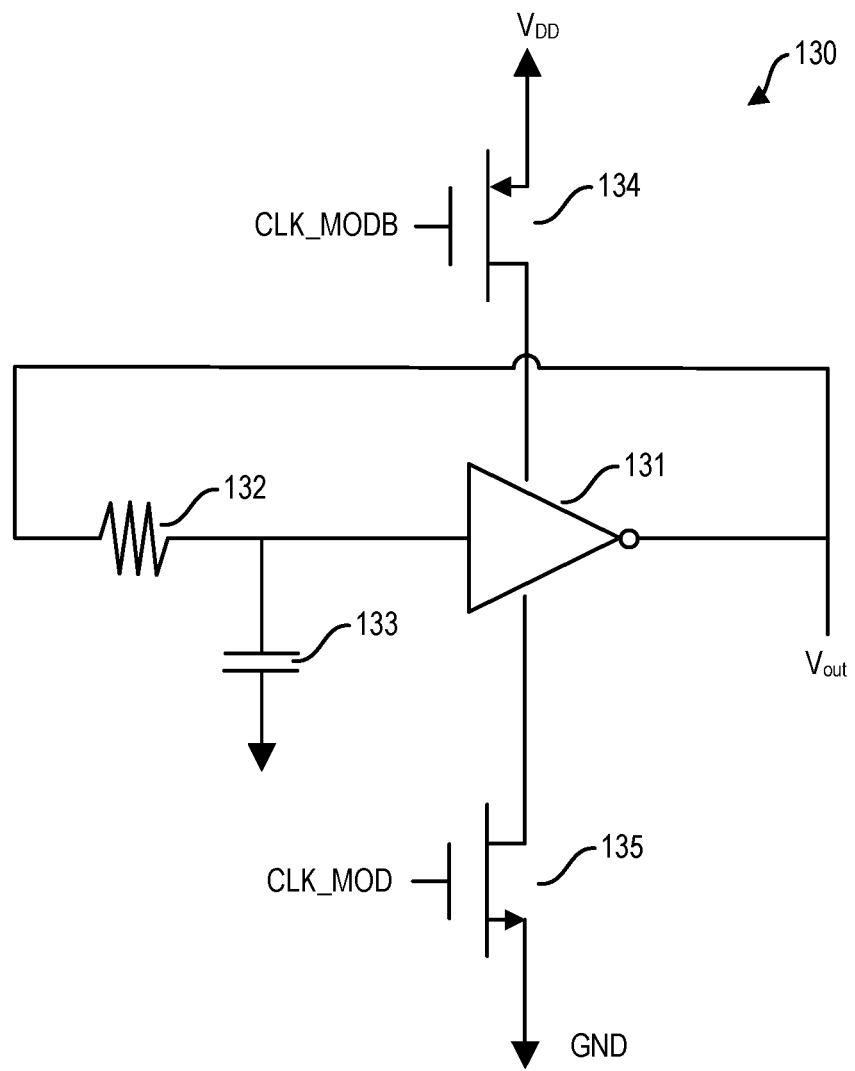
FIG. 2 illustrates a circuit diagram of a modulated active inductor according to various examples.

FIG. 2 shows a modulated active inductor 130 according to various examples. The active inductor 130 may include a first switch 134 and a second switch 135, which may be p-channel and n-channel MOSFETs, respectively, each of which are coupled to respective power and return inputs of the inverter 131. The source terminal of the first switch 134 is coupled to a voltage supply VDD, and the source terminal of the second switch 135 is coupled to ground or a common potential. Resistor 132 and capacitor 133 are further provided, as described above in relation to FIG. 1A. According to the example shown in FIG. 2, the delayed clock signal CLK_MOD may be a differential clock signal that also includes a complementary delayed clock signal CLK_MODB, which is 180 degrees out of phase with the delayed clock signal CLK_MOD. The delayed clock signal CLK_MOD and the complementary delayed clock signal CLK_MODB may respectively turn on the second switch 135 and the first switch 134 in order to enable the active inductor 130. For example, when the delayed clock signal CLK_MOD is in a logic high state and the complementary delayed clock signal CLK_MODB is in a logic low state, the first switch 134 and second switch 135 are turned on, which enables the inverter 131. When the delayed clock signal CLK_MOD is in a logic low state and the complementary delayed clock signal CLK_MODB is in a logic high state, the first switch 134 and the second switch 135 are turned off, which disables the inverter 131. As explained above, when the inverter 131 is enabled, the output signal Vout is fed back via resistor 132 to the input of the inverter 131, which inverts the output signal Vout to improve the delay of the output signal Vout relative to the input signal Vin. When the delayed clock signal CLK_MOD and complementary delayed clock signal CLK_MODB are in logic low and logic high states, respectively, the inverter 131 is disabled to reduce power dissipation.

Figure 3A:
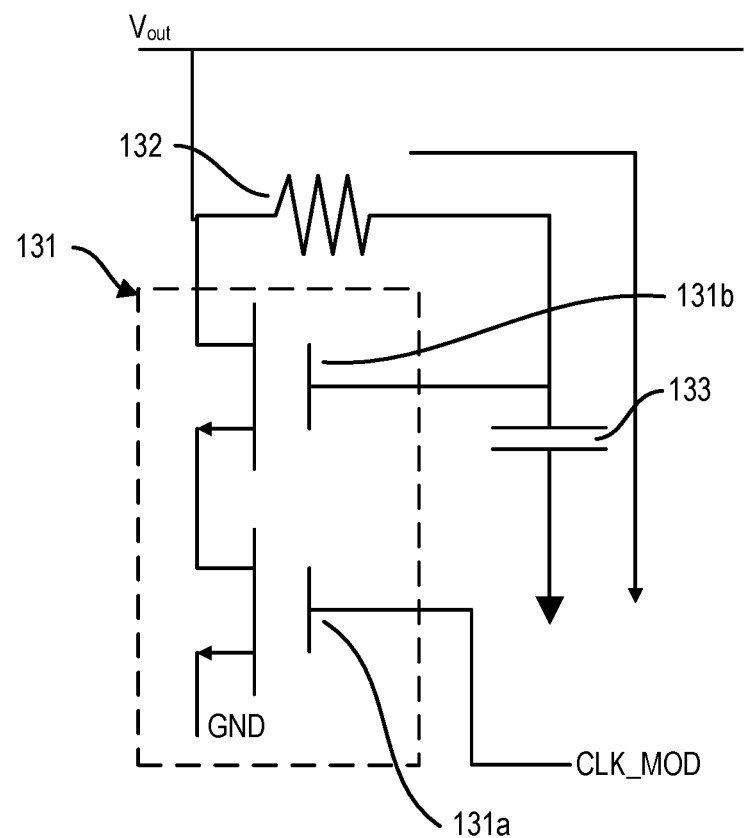
FIG. 3A illustrates a circuit diagram of a selectively modulated active inductor according to various examples.

According to various examples, the modulated active inductor 130 may be designed to improve the timing delay of a rising edge or of a falling edge of the output signal Vout. FIG. 3A shows a circuit diagram of the modulated active inductor 130 according to various examples, in which the time delay during the falling edge of the output signal Vout may be improved. According to the example shown in FIG. 3A, the inverter 131 may include first and second n-channel MOSFETs 131a, 131b connected in series, with the gate of the second MOSFET 131b coupled between a first end of the resistor 132 and a first end of the capacitor 133. In this example, the gate of the second n-channel MOSFET 131b is the input to the inverter 131, and the drain of the second n-channel MOSFET 131b is the output of the inverter 131. The gate of the first n-channel MOSFET 131a is coupled to the delayed clock signal CLK_MOD, the source of the first n-channel MOSFET 131a is coupled to ground or a common potential, and the drain of the second n-channel MOSFET 131b is coupled to a second end of the resistor 132, and provides the output signal Vout, as mentioned above. A second end of the capacitor 133 is coupled to ground, or a common potential. In this configuration, the capacitor 133 charges in the direction indicated by the arrow in FIG. 3A, through resistor 132, when Vout is at a high level, thereby turning on second n-channel MOSFET 131b after the charge across the capacitor 133 has reached a predetermined level. The modulated active inductor 130 may improve the time delay during a falling edge of the output voltage Vout relative to the input signal Vin. When the modulated clock signal CLK_MOD goes high, preceding the falling edge of the output voltage Vout, the modulated clock signal CLK_MOD turns on first n-channel MOSFET 131a, opening up a path to the ground through inverter 131, since capacitor 133 is charged to the voltage of the high logic state. When second inverter 113 of circuit 110 begins to drive the output signal Vout low, it is assisted by inverter 131, resulting in a rapid pull down. The capacitor 133 discharges through resistor 132 until it turns off second n-channel MOSFET 131b, so as to disable the modulate active inductor 130 after the transition of the output signal. By not enabling the modulated active inductor 130 during the rising edge of the output signal Vout, since second n-channel MOSFET 131b is off because of the discharge condition of capacitor 133, power consumption may be reduced while still improving the time delay of the output signal Vout, relative to the input signal Vin, during the falling edge of the output signal Vout. Inverter 131 is in parallel with second inverter 113 (FIG. 1A), and as a result may be sized appropriately so that in the event that there is no transition, i.e. Vin was at a logic high during a previous period of clock signal CLK, and remains high during a present period of clock signal CLK, inverter 131 does not have sufficient pull down drive so as to overpower the pullup drive of second inverter 113, and thereby inappropriately change the logic state of Vout.

Figure 3B:
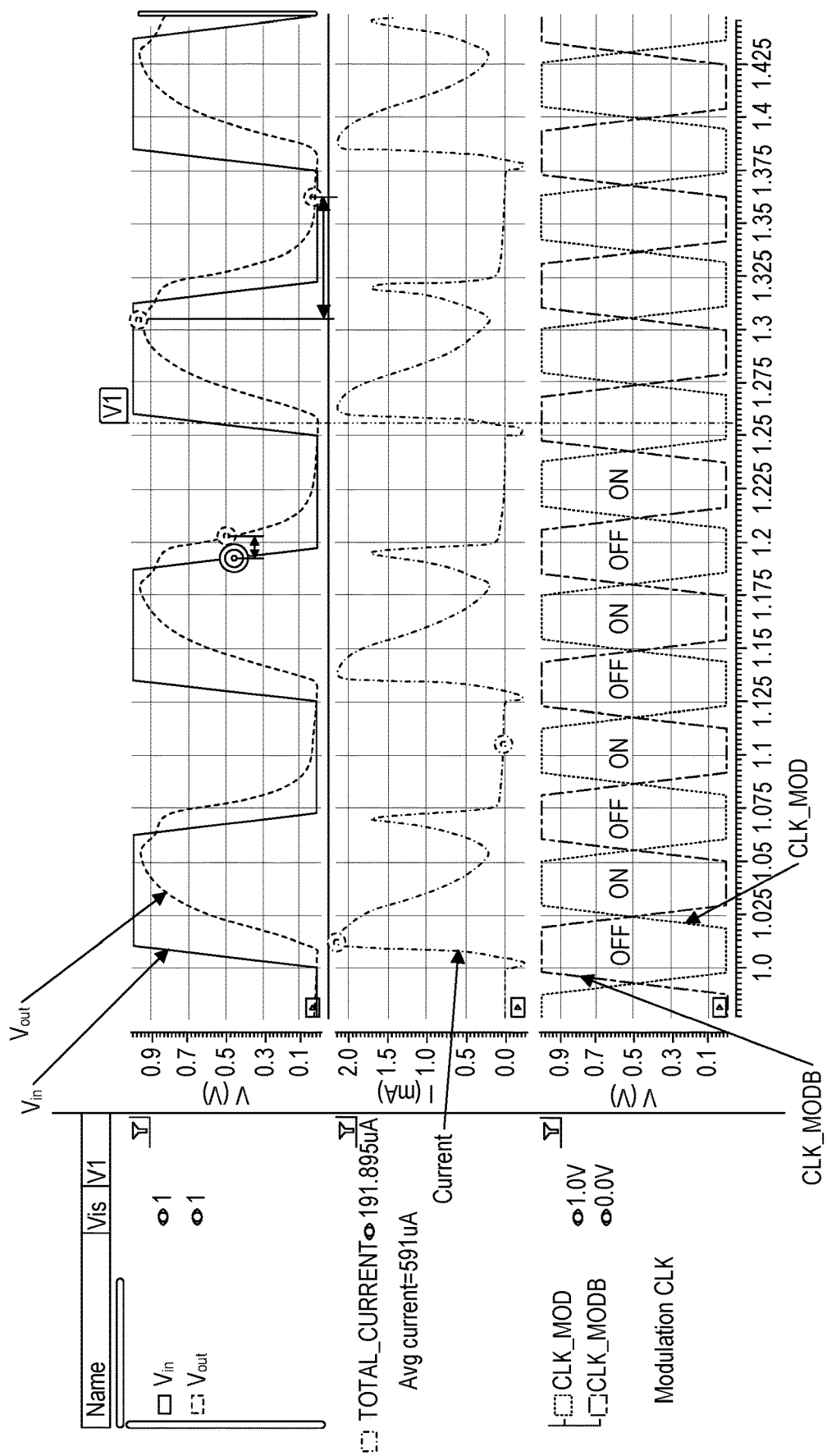
FIG. 3B shows waveform diagrams of the input signal, output signal, current, and modulated clock signal of a circuit with active inductor modulation based on the falling edge of the output signal according to various examples.

FIG. 3B shows sample waveforms for the input signal Vin, the output signal Vout, the current, the delayed clock signal CLK_MOD and the complementary delayed clock signal CLK_MODB based on the selective modulation scheme described above in connection with FIG. 3A regarding the falling edge of the output signal Vout. As shown in FIG. 3B, the delay between the input signal Vin and the output voltage Vout remains approximately 9 ps, and the voltage swing of the output voltage Vout remains approximately 960 mV, however the average current is reduced to approximately 590 uA, as compared to the waveforms of FIG. 1B.

Figure 4A:
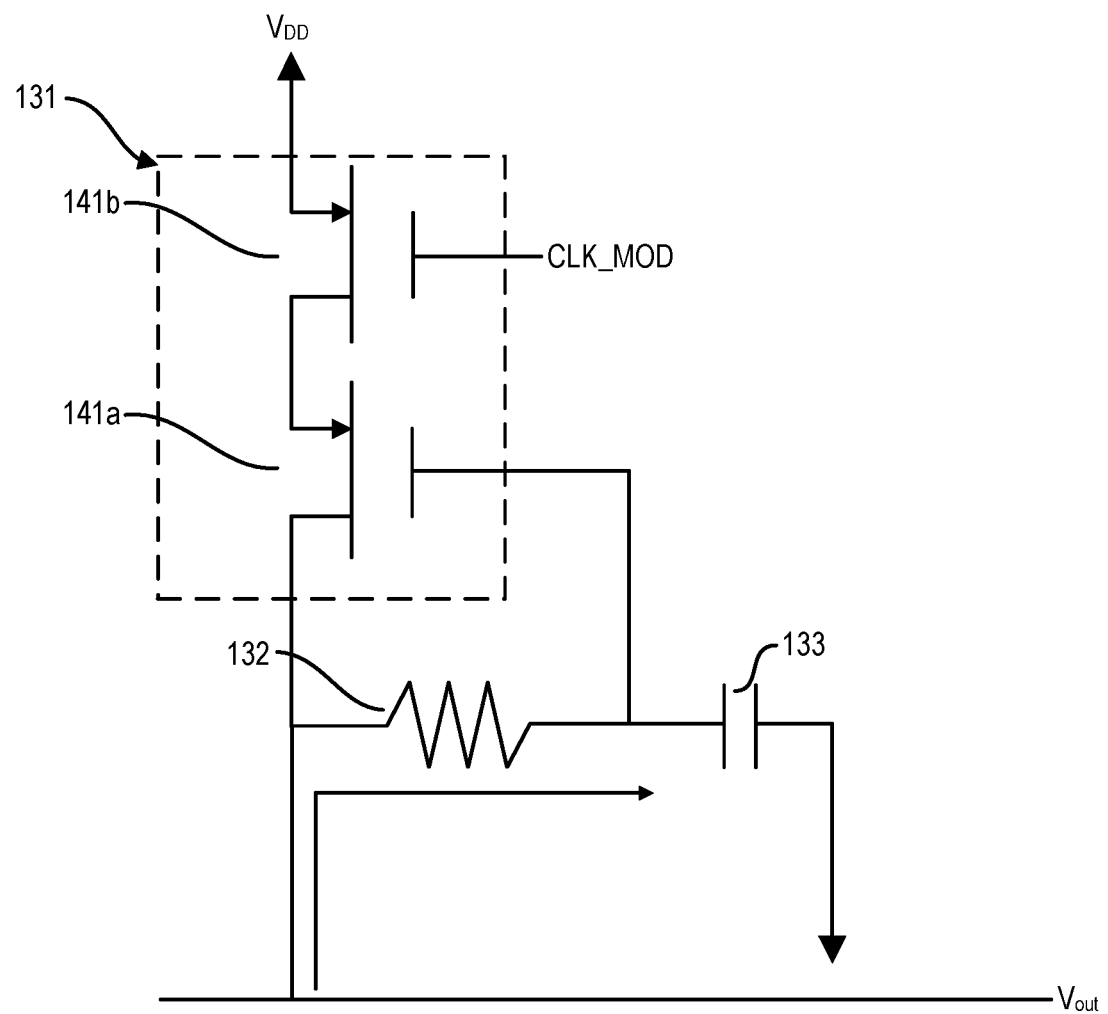
FIG. 4A illustrates a circuit diagram of a selectively modulated active inductor according to various examples.

Alternatively, the modulated active inductor 130 may be designed to improve the time delay during the rising edge of the output signal Vout, as shown in FIG. 4A. According to the example shown in FIG. 4A, the inverter 131 may include first and second p-channel MOSFETs 141a, 141b connected in series, with the gate of the first p-channel MOSFET 141a coupled between a first end of the resistor 132 and a first end of the capacitor 133, and may represent the input of the inverter 131. The gate of the second p-channel MOSFET 141b is coupled to the delayed clock signal CLK_MOD, and the drain of the first p-channel MOSFET 141a, representing the output of the inverter 131, is coupled to a second end of the resistor 132, and provides the output signal Vout. A second end of the capacitor 133 is coupled to ground, or a common potential. The source of second p-channel MOSFET 141b is coupled to a voltage source, e.g. Vdd, and the drain of second p-channel MOSFET 141b is coupled to the source of first p-channel MOSFET 141a. In this configuration, when output signal Vout is low, the capacitor 133 discharges, turning on first p-channel MOSFET 141a. When the delayed clock signal CLK_MOD falls low, the delayed clock signal CLK_MOD turns on second p-channel MOSFET 141b, opening up a path to the positive voltage Vdd through inverter 131 to the output terminal of circuit 110. When second inverter 113 of circuit 110 begins to drive the output signal Vout high, it is assisted by inverter 131, resulting in a rapid pull up. The capacitor 133 charges through resistor 132 in the direction indicated by the arrow in FIG. 4A, until it turns off first p-channel MOSFET 131a, so as to disable the modulated active inductor 130 after the transition of the output signal. The modulated active inductor 130 may improve the time delay during a rising edge of the output signal Vout relative to the input signal Vin. By not enabling the active inductor circuit 130 in during the falling edge of the output voltage Vout, power consumption may be reduced while still reducing the time delay of the output voltage Vout. Inverter 131 is in parallel with second inverter 113 (FIG. 1A), and as a result may be sized appropriately so that in the event that there is no transition, i.e. Vin was at a logic low during a previous period of clock signal CLK, and remains low during a present period of clock signal CLK, inverter 131 does not have sufficient pull up drive so as to overpower the pulldown drive of second inverter 113, and thereby inappropriately change the logic state of Vout.

Figure 4B:
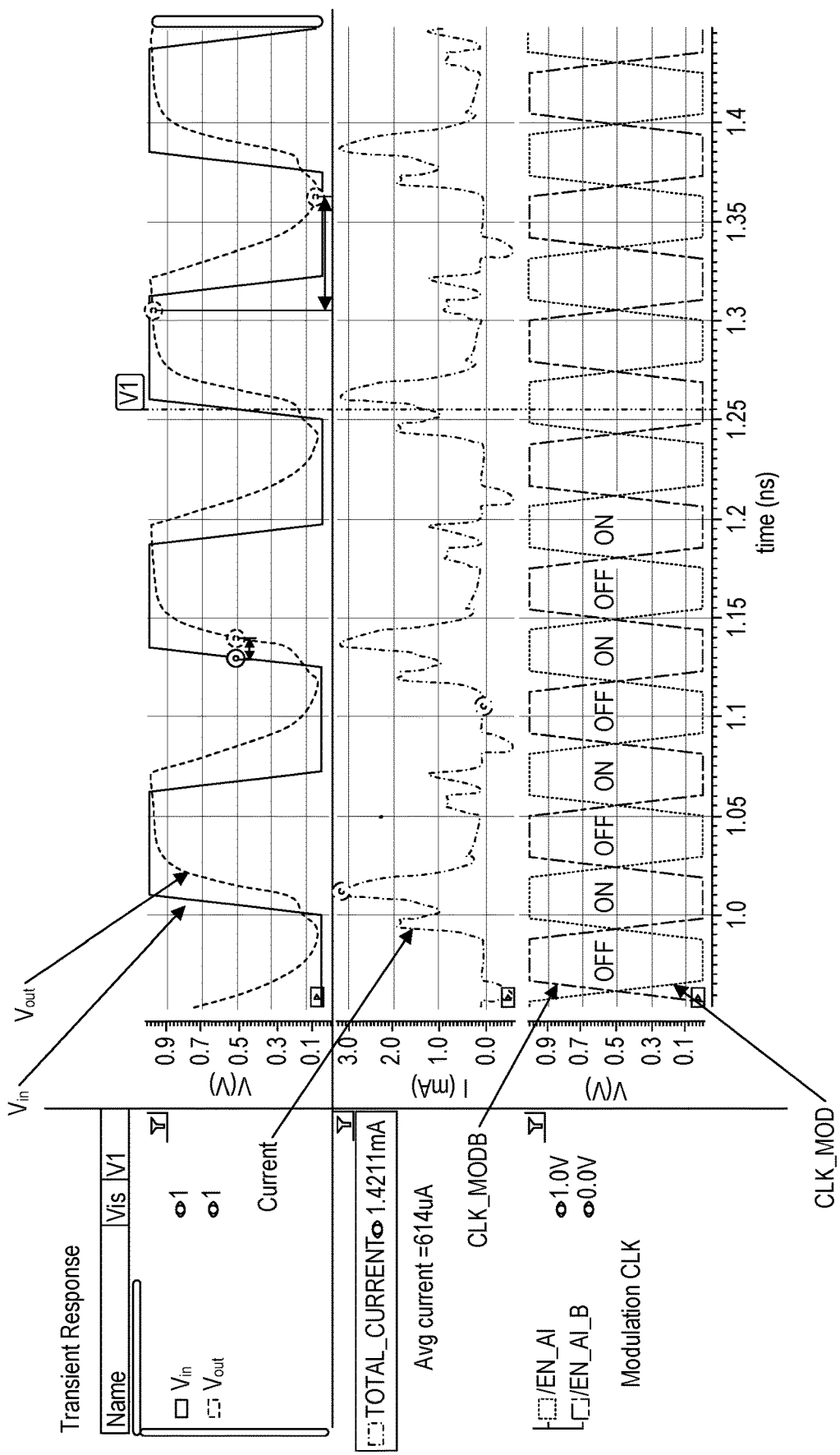
FIG. 4B shows waveform diagrams of the input signal, output signal, current, and modulated clock signal of a circuit with active inductor modulation based on the rising edge of the output signal according to various examples.

FIG. 4B shows waveform diagrams of the input signal Vin, output signal Vout, current, delayed clock signal CLK_MOD and complementary delayed clock signal CLK_MODB of a circuit with active inductor modulation based on the rising edge of the output voltage according to various examples. As shown in FIG. 4B, the delay between the input signal Vin and the output signal Vout remains approximately 9 ps, and the voltage swing of the output signal Vout remains approximately 960 mV, however the average current is reduced to approximately 610 uA, as compared to the waveforms of FIG. 1B.

Various examples have been disclosed herein, in connection with the above description and the drawings. It will be understood that it would be unduly repetitious to literally describe and illustrate every combination and subcombination of these examples. Accordingly, all examples can be combined in any way and/or combination, and the present specification, including the drawings, shall be construed to constitute a complete written description of all combinations and subcombinations of the examples described herein, and of the manner and process of making and using them, and shall support claims to any such combination or subcombination.

It will be appreciated by persons skilled in the art that the examples described herein are not limited to what has been particularly shown and described herein above. In addition, unless mention was made above to the contrary, it should be noted that all of the accompanying drawings are not to scale. A variety of modifications and variations are possible in light of the above teachings.

What is claimed is:

1. An active inductor modulator circuit comprising:
a circuit to receive an input signal and provide an output signal at an output terminal of the circuit based on a clock signal;
a modulated active inductor coupled to the circuit to improve a time delay between the input signal and the provided output signal; and
a modulation clock circuit to generate a delayed clock signal to enable the modulated active inductor prior to a transition of the output signal from a first logic state to a second logic state.

2. The active inductor modulator circuit of claim 1, wherein the modulation clock circuit is to receive the clock signal and generate the delayed clock signal, wherein the delayed clock signal is delayed relative to the clock signal.

3. The active inductor modulator circuit of claim 1, wherein the modulated active inductor comprises an inverter, a resistor coupled in parallel with the inverter, and a capacitor coupled in series with the resistor and the inverter; and
wherein the resistor and the inverter are coupled to an output terminal of the circuit that provides the output signal.

4. The active inductor modulator circuit of claim 1, wherein the modulated active inductor comprises an inverter, a resistor coupled in parallel with the inverter, a capacitor coupled in series with the resistor, a first switch coupled to a voltage supply and a second switch coupled to ground, wherein the first switch and the second switch are coupled to the inverter;
wherein the modulation clock circuit is to generate a complementary delayed clock signal that is 180 degrees out of phase with the generated delayed clock signal; and
wherein the complementary delayed clock signal and the delayed clock signal are to turn on the first switch and the second switch, respectively.

5. The active inductor modulator circuit of claim 1, wherein the modulation clock circuit is to disable the modulated active inductor after the transition of the output signal from the first logic state to the second logic state.

6. The active inductor modulator circuit of claim 1, wherein the first logic state is a logic low state and the second logic state is a logic high state.

7. The active inductor modulator circuit of claim 6, wherein the modulated active inductor comprises an inverter that includes first and second p-channel MOSFETs coupled in series, a resistor coupled between gate and drain terminals of the first p-channel MOSFET, and a capacitor coupled between the gate terminal of the first p-channel MOSFET and ground; and
wherein the second p-channel MOSFET includes a gate terminal to receive the delayed clock signal, a source terminal coupled to a voltage supply, and a drain terminal coupled to a source terminal of the first p-channel MOSFET;
wherein the output signal is provided at the drain terminal of the first p-channel MOSFET.

8. The active inductor modulator circuit of claim 6, wherein the modulated active inductor comprises an inverter that includes first and second p-channel MOSFETs coupled in series to selectively couple the output terminal of the circuit to a voltage supply based on the delayed clock signal;
wherein a gate terminal of the second p-channel MOSFET is to receive the delayed clock signal, and a gate terminal of the first p-channel MOSFET is coupled to a capacitor and to the output terminal of the circuit via a resistor;
wherein the first and second p-channel MOSFETs are to couple the output terminal of the circuit to the voltage supply prior to a rising edge of the output signal.

9. The active inductor modulator circuit of claim 1, wherein the first logic state is a logic high state and the second logic state is a logic low state.

10. The active inductor modulator circuit of claim 9, wherein the modulated active inductor comprises an inverter that includes first and second n-channel MOSFETs coupled in series, a resistor coupled between gate and drain terminals of the second n-channel MOSFET, and a capacitor coupled between the gate terminal of the second n-channel MOSFET and ground; and
wherein the first n-channel MOSFET includes a gate terminal coupled to the modulation clock circuit to receive the delayed clock signal, a source terminal coupled to ground, and a drain terminal coupled to a source terminal of the second n-channel MOSFET;
wherein the output signal is provided at the drain terminal of the second n-channel MOSFET.

11. The active inductor modulator circuit of claim 9, wherein the modulated active inductor comprises an inverter that includes first and second n-channel MOSFETs coupled in series to selectively couple the output terminal of the circuit to ground based on the delayed clock signal;
wherein a gate terminal of the first n-channel MOSFET is to receive the delayed clock signal, and a gate terminal of the second n-channel MOSFET is coupled to a capacitor and to the output terminal of the circuit via a resistor;
wherein the first and second n-channel MOSFETs are to couple the output terminal of the circuit to ground prior to a falling edge of the output signal.

12. A method of improving a time delay between an input signal and an output signal of a circuit, the method comprising:
receiving the input signal based on a clock signal;

generating a delayed clock signal based on the clock signal;

enabling a modulated active inductor that is coupled to the circuit prior to a transition of the output signal from a first logic state to a second logic state based on the delayed clock signal; and outputting the output signal that is time-delayed relative to the input voltage by the time delay.

13. The method of claim 12, wherein said generating the delayed clock signal comprises generating the delayed clock signal so that the delayed clock signal is delayed relative to the clock signal.

14. The method of claim 12, comprising generating a complementary delayed clock signal that is 180 degrees out of phase with the delayed clock signal; and wherein said enabling the modulated active inductor comprises turning on first and second switches of the modulated active inductor based on the complementary delayed clock signal and the delayed clock signal, respectively.

15. The method of claim 12, comprising disabling the modulated active inductor circuit after the transition of the output signal from the first logic state to the second logic state.

16. The method of claim 12, wherein said first logic state is a logic low state and said second logic state is a logic high state.

17. The method of claim 16, wherein said enabling the modulated active inductor comprises coupling an output terminal of the circuit to a voltage supply based on the delayed clock signal prior to a rising edge of the output signal.

18. The method of claim 12, wherein said first logic state is a logic high state and said second logic state is a logic low state.

19. The method of claim 18, wherein said enabling the modulated active inductor comprises coupling an output terminal of the circuit to ground based on the delayed clock signal prior to a falling edge of the output signal.

\* \* \* \* \*